(12) United States Patent
Tang et al.

(10) Patent No.: US 6,246,115 B1
(45) Date of Patent: Jun. 12, 2001

(54) SEMICONDUCTOR PACKAGE HAVING A HEAT SINK WITH AN EXPOSED SURFACE

(75) Inventors: Tom Tang, ChangHwa Esien; Chien Ping Huang, Hsinchu Hsien; Kevin Chiang, Taichung Hsien; Jeng-Yuan Lai, Taichung; Candy Tien, Taichung Hsien; Vicky Liu, Pingtung, all of (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 09/425,145

(22) Filed: Oct. 21, 1999

(30) Foreign Application Priority Data

Oct. 21, 1998 (TW) ................................................ 087117375

(51) Int. Cl.⁷ .......................... H01L 23/10; H01L 23/02; H01L 23/12; H01L 23/34

(52) U.S. Cl. ....................... 257/706; 257/704; 257/710; 257/712; 257/713; 257/717; 257/675; 257/738; 257/723; 257/737; 257/787; 257/796; 257/797

(58) Field of Search ................................. 257/706, 704, 257/675, 712, 713, 717, 720, 738, 737, 734, 777, 778, 796, 787, 797, 723; 438/125, 122

(56) References Cited

U.S. PATENT DOCUMENTS

| | | | |
|---|---|---|---|
| 5,311,060 | * | 5/1994 | Rostoker et al. ................... 257/796 |
| 5,329,160 | * | 7/1994 | Miura et al. ......................... 257/710 |
| 5,365,107 | * | 11/1994 | Kuraishi et al. ................... 257/673 |
| 5,468,910 | * | 11/1995 | Knapp et al. ........................ 174/52.2 |
| 5,552,635 | * | 9/1996 | Kim et al. ........................... 257/706 |
| 5,585,669 | * | 12/1996 | Venembre ............................ 257/679 |
| 5,598,321 | * | 1/1997 | Mostafazadeh et al. ............. 361/704 |
| 5,629,561 | * | 5/1997 | Shin et al. ........................... 257/712 |
| 5,650,918 | * | 7/1997 | Suzuki ................................. 361/760 |
| 5,656,864 | * | 8/1997 | Mitsue et al. ........................ 257/787 |
| 5,703,398 | * | 12/1997 | Sono et al. .......................... 257/706 |
| 5,710,459 | * | 1/1998 | Teng et al. ........................... 257/717 |
| 5,724,230 | * | 3/1998 | Poetzinger .......................... 361/758 |
| 5,789,810 | * | 8/1998 | Gross et al. ......................... 257/704 |
| 5,852,320 | * | 12/1998 | Ichihashi ............................. 257/419 |
| 5,881,944 | * | 3/1999 | Edwards et al. .................... 228/56.3 |
| 5,882,945 | * | 3/1999 | Saito et al. .......................... 436/547 |
| 5,886,876 | * | 3/1999 | Yamaguchi ......................... 361/767 |
| 5,889,323 | * | 3/1999 | Tachibana .......................... 257/704 |
| 5,898,219 | * | 4/1999 | Barrow ............................... 257/713 |

(List continued on next page.)

Primary Examiner—Alexander O. Williams
(74) Attorney, Agent, or Firm—Peter F. Corless; Edwards & Angell, LLP

(57) ABSTRACT

An integrated circuit package with a fully-exposed heat sink is provided. The integrated circuit package includes a substrate having a first side being formed with first conductive traces and a second side being formed with second conductive traces. At least one chip is mounted on the substrate and electrically connected to the first conductive traces. A plurality of solder balls are provided at the terminal ends of the second conductive traces to allow external connection of the chip. The fully-exposed heat sink is mounted on the substrate. The heat sink is formed with a plurality of supportive legs arranged in such a manner as to allow a bottom surface of the heat sink to be separated from the chip and a top surface of the heat sink to be tightly attached to a cavity in a mold used to form an encapsulant for enclosing the chip. A plurality of positioning tongues are formed on the heat sink for securing the heat sink in position when performing a molding process for forming the encapsulant. With this integrated circuit package, no jig is required in the assembly of the integrated circuit package. Moreover, since there is no need to use adhesives to adhere the supportive legs onto the substrate, the integrated circuit package would not suffer from delamination as in the case of the prior art. The fully-exposed heat sink allows an increased heat-dissipating efficient as compared to the prior art.

14 Claims, 3 Drawing Sheets

U.S. PATENT DOCUMENTS

| | | | | |
|---|---|---|---|---|
| 5,907,189 | * | 5/1999 | Mertol | 257/787 |
| 5,909,056 | * | 6/1999 | Mertol | 257/704 |
| 5,931,222 | * | 8/1999 | Toy et al. | 257/722 |
| 5,939,784 | * | 8/1999 | Glenn | 257/710 |
| 5,956,576 | * | 9/1999 | Toy et al. | 438/125 |
| 5,977,626 | * | 11/1999 | Wang et al. | 257/707 |
| 5,982,038 | * | 11/1999 | Toy et al. | 257/772 |
| 5,990,418 | * | 11/1999 | Bivona et al. | 174/52.4 |

* cited by examiner

SEMICONDUCTOR PACKAGE HAVING A HEAT SINK WITH AN EXPOSED SURFACE

BACKGROUND OF THE INVENTION

1. Field of the Invention

This invention relates to integrated circuit package technology, and more particularly, to an integrated circuit package with a heat sink for dissipating heat generated by integrated circuit chip.

2. Description of Related Art

An integrated circuit chip is capable of holding a very great number of circuit components, including resistors, capacitors, and transistors, in a very small semiconductor die. In use, an integrated circuit chip is typically enclosed in a package for easy handling. To allow increased functionality from a single integrated circuit package, a number of integrated circuit chips can be mounted together in one package. This type of integrated circuit package is customarily referred to as a multi-chip-module integrated circuit package.

In the manufacture of integrated circuit packages, there are two major topics in design; heat dissipation and pin arrangement. Heat dissipation is typically provided by mounting a heat sink to the chip, while pin arrangement is now designed using the so-called Ball Grid Array (BGA) technology. The BGA structure is typically provided with arrayed solder balls on the bottom on an integrated circuit package to allow the integrated circuit package to be electrically bonded to external circuitry. In this case, the heat sink can only be mounted on the top side of the integrated circuit package. One such integrated circuit package is disclosed in U.S. Pat. No. 5,736,785, which is schematically illustrated in FIG. 5. As shown, this patented integrated circuit package, here indicated by the reference numeral 1, includes a substrate 104 on which an integrated circuit chip 102 is mounted. A heat sink 116 is mounted on the substrate 104 for heat dissipation. The chip 102, the substrate 104, and the heat sink 116 are all enclosed in an encapsulation 112 formed by encapsulating resin. The heat sink 116 is formed with a circular recessed portion 116a whose bottom side is adhered by silver glue onto the top side of the chip 102. This allows the heat generated by the chip 102 to be dissipated via the heat sink 116 to the atmosphere. The heat sink 116 is further formed with a recessed portion 116c whose depth is larger than the depth of the recessed portion 116a. By means of the recessed portion 116c, the heat sink 116 can be securely mounted on the top side of the substrate 104. Further, the heat sink 116 is formed with a part of heat sink 116 to come in contact with the atmosphere so that the heat can be dissipated to the atmosphere.

The foregoing integrated circuit package of FIG. 5, however, has some drawbacks. First, the heat sink 116 would be off-center to the encapsulant 112 due to he reason that the mounting of the heat sink 116 on the chip 102 requires the use of a jig (not shown) for precise positioning of the heat sink 116, and the use of this jig requires a tolerance to be left between the heat sink 116 and the jig (not shown), which would make the heat sink 116 to be slightly deviated in position from the chip 102. The off-center arrangement of the heat sink 116 would make the outer appearance of the integrated circuit package unappealing.

Second, since the heat sink 116 is different in thermal expansion coefficient from the chip 102, delamination could occur to the silver paste layer used to adhere the heat sink 116 to the chip 102 under high-temperature condition during the transfer molding process. This would make the heat sink 116 easily loosen off position from the chip 102.

Third, the chip 102 could be easily cracked during the transfer molding process due to the pressure from the molding resin flow via the circular recessed portions 116a against the chip 102 which is delicate and weak in structure.

Fourth, the encapsulation 112 would be easily formed with undesired voids therein. This is because that the molding resin flow during the transfer molding process would be blocked by the recessed portions 116a, 116c, thus causing disturbances to the molding resin flow, resulting in the forming of voids in the encapsulant 112.

FIG. 6 is a schematic sectional view of another conventional integrated circuit package, as indicated by the reference numeral 2. As shown, this integrated circuit package 2 includes a substrate 21 on which an integrated circuit chip 20 is mounted. A heat sink 22 is mounted on the substrate 21 for heat dissipation. The chip 20, the substrate 21, and the heat sink 22 are all hermetically enclosed in an encapsulant 23. The heat sink 23 has a circular upper portion 220 and a bottom portion 222. The upper portion 220 defines an area 221 to enclose the chip 20 therein, and the bottom portion 222 is used to support the upper portion 220 at an elevated height from the substrate 21. The upper portion 220 has a top surface 223 exposed to the outside of the compound 23. In order to allow the heat sink 22 to be precisely positioned on the substrate 21, a jig (not shown) should be used. Hence, the drawback of off-center arrangement in the integrated circuit package of FIG. 5 still exists in the integrated circuit package of FIG. 6. Moreover, since the bottom portion 222 of the heat sink 22 is mounted on the substrate 21 by using an adhesive material, the integrated circuit package of FIG. 6 would easily suffer from delamination as in the case of the integrated circuit package of FIG. 5. Further, one particular drawback to the integrated circuit package of FIG. 6 is that the resin flow used in the transfer molding process to form the encapsulant 23 would be flashed over the top surface 223 of the heat sink 22 if the bottom portion 222 is insufficiently elevated to allow the top surface 223 of the heat sink 22 to be adequately exposed to the outside of the encapsulant 23. When flashing happens, it would also cause the exposed area of the heat sink 22 to be reduced, thus lessening the heat dissipating efficiency by the heat sink 22; and whereas, if the bottom portion 222 of the heat sink 22 is overly elevated, it would cause the top surface 223 to abut overly forcibly on the mold (not shown) used in the transfer molding process, thus causing delamination to the adhesive materiale layer between the substrate 21 and the bottom of the bottom portion 222. Moreover, the upper portion 220 and the bottom portion 222 of the heat sink 22 would cause disturbance to the resin flow used in the transfer molding process, thus causing the resulted encapsulant 23 to be formed with undesired voids. The use of the integrated circuit package of FIG. 6 is therefore still unsatisfactory.

The particular structures of the heat sinks 116, 22 used in the integrated circuit packages of FIGS. 5 and 6 would make the chip mounting area such small that they are used chiefly to pack one chip therein and hardly can be used to pack two or more chips. Therefore, they would not meet multi-chip-module package requirements.

SUMMARY OF THE INVENTION

It is therefore an objective of the present invention to provide an integrated circuit package with a fully-exposed heat sink, which can be assembled without the use of a jig and silver paste, while nonetheless allowing the heat sink to be positioned precisely on the substrate.

It is another objective of the present invention to provide an integrated circuit package with a fully-exposed heat sink, which can help prevent the molding resin used in the compound molding process to flash over the exposed surface of the heat sink.

It is still another objective of the present invention to provide an integrated circuit package with a fully-exposed heat sink, which is formed with a large chip mounting area so that is can be used to pack two or more integrated circuit chips therein.

It is yet another objective of the present invention to provide an integrated circuit package with a fully-exposed heat sink, which can help prevent the resin flow used in the compound molding process to be subjected to disturbance so as to prevent the forming of undesired voids in the resulting compound.

It is still another objective of the present invention to provide an integrated circuit package with a fully-exposed heat sink, which has an increased heat-dissipating efficiency as compared to the prior art.

It is still yet another objective of the present invention to provide an integrated circuit package with a fully-exposed heat sink, which requires no use of adhesive layer to adhere the heat sink to the chip so that no delamination would occur.

It is still yet another objective of the present invention to provide an integrated circuit package with a fully-exposed heat sink, which is simpler and easier to assemble so that manufacturing cost can be reduced as compared to the prior art.

In accordance with the foregoing and other objectives of the present invention, a new integrated circuit package with a fully-exposed heat sink is provided. The integrated circuit package of the invention includes the following constituent parts: (a) a substrate having a first side and a second side; (b) first conductive traces formed on the first side of the substrate; (c) second conductive traces formed on the second side of the substrate; (d) at least one chip, which is mounted on the first side of the substrate and electrically connected to the first conductive traces; (e) a plurality of solder balls provided at the terminal ends of the second conductive traces to allow external connection of the chip; (f) a heat sink mounted on the first side of the substrate, the heat sink being formed with a plurality of openings each being used for receiving an injection pin on a mold used in a compound molding process; and the heat sink being further formed with a plurality of supportive legs arranged in such a manner as to allow a bottom surface of the heat sink to be separated from the chip and a top surface of the heat sink to be tightly attached to a top wall of a cavity in the mold; (g) a plurality of positioning tongues formed on the heat sink for securing the heat sink in position when performing the compound molding process; and (h) an encapsulant which hermetically encloses the chip and part of the heat sink therein.

The supportive legs are integrally formed with the heat sink and arranged on sides of the heat sink, and each is formed with a hole to help enforce the bonding between the heat sink and the encapsulant. The openings of the heat sink are formed near the corners of the heat sink and are each formed with a toothed inner wall so as to help enforce the bonding between the heat sink and the encapsulant.

The positioning tongues integrally formed on the sides of the heat sink is shaped with a curved edge so that this curved edge is abutted on the side wall of the cavity, after the heat sink is disposed in the cavity of the mold, and thereby allowing the heat sink to be secured in the intended position. Hence, no jig is required. Moreover, since there is no need to adhere the supportive legs onto the substrate by adhesives, the drawback of delamination in the case of the prior art can be eliminated.

Moreover, in order to allow the heat sink to be reliably secured to the compound, a plurality of recessed portion can be formed in the sides of the heat sink.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

A preferred embodiment of the integrated circuit package of the invention is disclosed in full detail in the following with reference to FIGS. 1–4.

Figure 1:
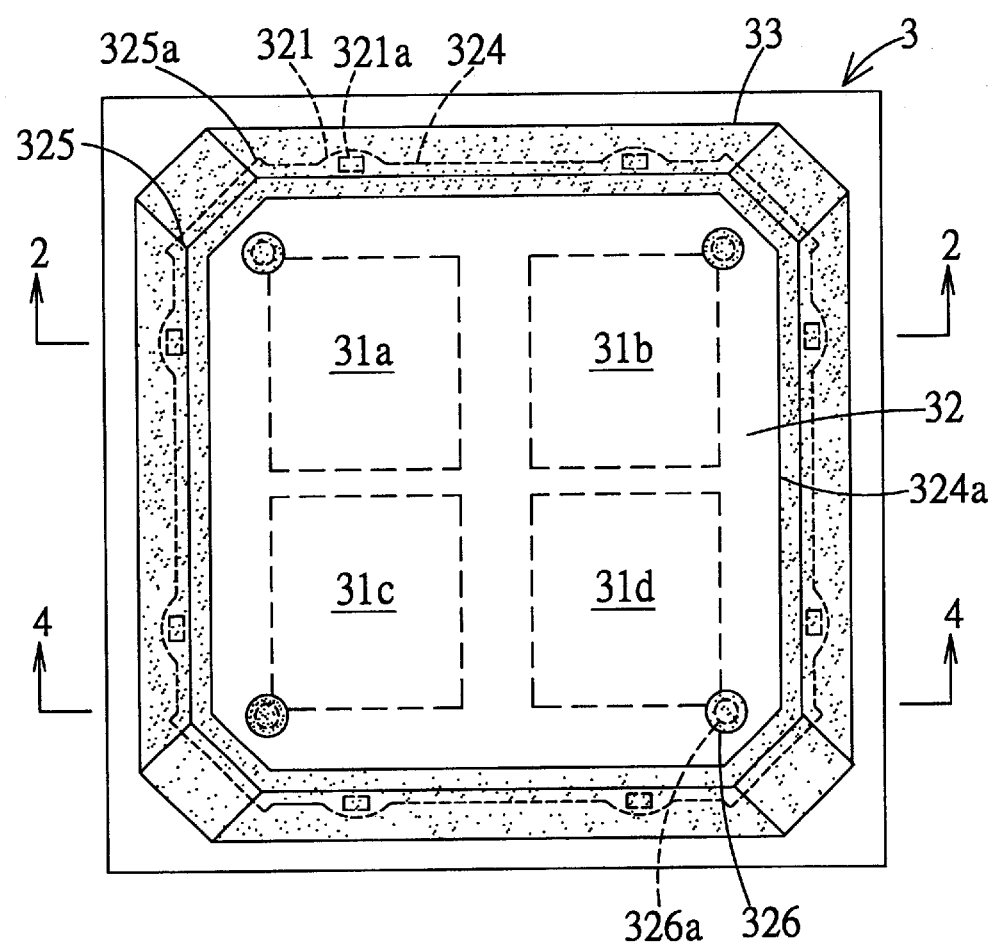
FIG. 1 is a schematic top view of the integrated circuit package of the invention.
Figure 2:
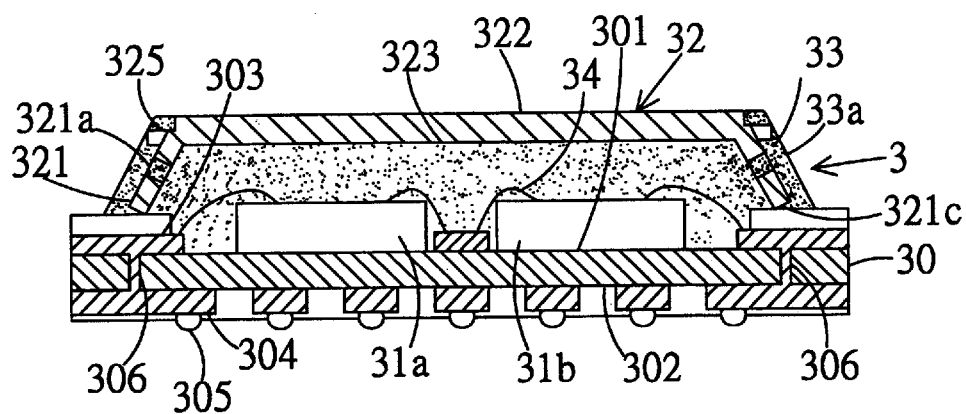
FIG. 2 is a cross sectional view of the integrated circuit package of FIG. 1 cutting through the line 2—2.

Referring first to FIGS. 1 and 2, the integrated circuit package of the invention includes a substrate 30 (which is used to mount a number of chips 31a, 31b, 31c, and 31d thereon), a heat sink 32 disposed over the substrate 30, and an encapsulant 33 enclosing the chips 31a, 31b, 31c, and 31d and part of the heat sink 32.

The substrate 30 has a first side 301 and a second side 302 opposite to the first side 301. The first side 301 of the substrate 30 is mounted with a first conductive traces 303 which is electrically connected via a plurality of gold wires 34 to the chips 31a, 31b, 31c, and 31d of course, electrical interconnection between the substrate 30 and chips 31a, 31b, 31c, and 31d may instead by made by other conventional methods, such as tape automated bonding (TAB), flip chip bonding, and the like. Further, the second side 302 of the substrate 30 is mounted with second conductive traces 304. An array of solder balls 305 are mounted at the terminal ends of the second conductive traces 304, which allow the chips 31a, 31b, 31c, and 31d to be electrically bonded to external circuitry, such as a printed circuit board (PCB), (now shown). Both the first and second conductive traces 303, 304 are preferably mad of copper. Further, the substrate 30 is formed with a plurality of conductive vias 306 which penetrate through the substrate 30 from the first side 301 to the second side 302. These conductive vias 306 allow the first conductive traces 303 to be electrically connected to the second conductive traces 304.

The heat sink 32 is formed from a metal, such as aluminum, aluminum alloy, copper, copper alloy, and the like and is shaped into a rectangular form. The heat sink 32 is formed with openings 326 on the four corners thereof for injection pins 51 in a mold 5 (FIG. 4) to penetrate therethrough in order to keep the heat sink 32 in position without dislocation. Moreover, the heat sink 32 is formed with a plurality of outward-extending positioning tongues 325 and a plurality of downward-extending supportive legs 321. The inner wall 326a of each of the openings 326 can be toothed or irregularly shaped so as to help enforce the bonding between the heat sink 32 and the encapsulant 33. Moreover, the supportive legs 321 are each formed with a through hole 321a which can further help enforce the bonding between the heat sink 32 and the compound 33. Since t of each of the supportive legs 321 downwardly outwardly extends from the side 324 of the heat sink 32, making the bottom 321c of each of the supportive legs 321 being located outside the plane of the heat sink 32, the substrate 30 can provide a larger chip mounting area than the prior art, so that more chips can be mounted in the integrated circuit package. It is to be noted that, in order to allow the bottom 321c of each of the supportive legs 321 to be located beyond the side 324 of the heat sink 32, the gap between the side 324 of the heat sink 32 and the outer wall 33a of the encapsulant 33 should be no more than 0.1 mm.

Figure 4:
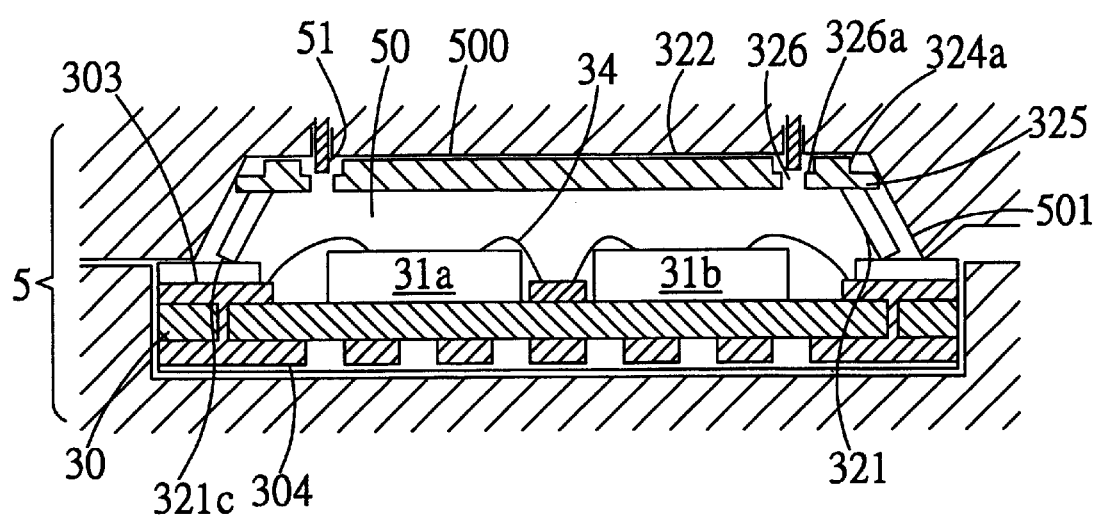
FIG. 4 is a cross sectional view of the integrated circuit package of FIG. 1 cutting through the line 4—4 when the integrated circuit package is molded in a compound.
Figure 5:
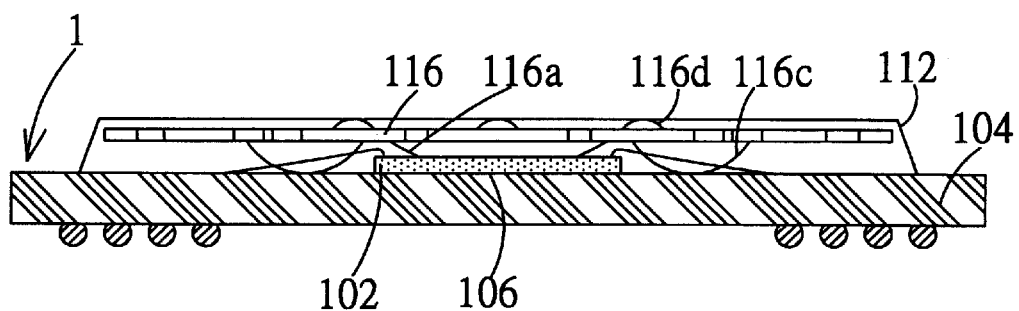
FIG. 5 is a schematic sectional view of a conventional integrated circuit package.
Figure 6:
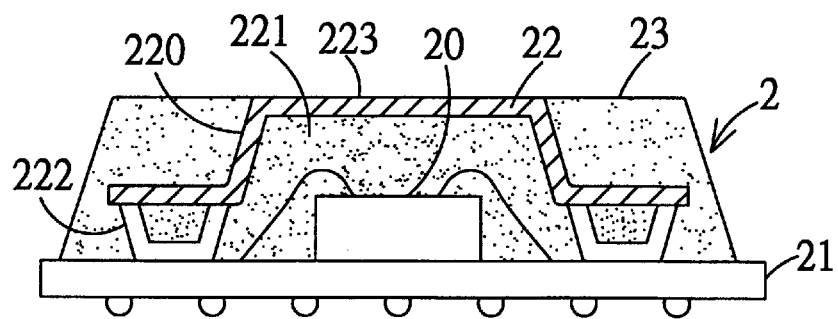
FIG. 6 is a schematic sectional view of another conventional integrated circuit package.

The supportive legs 321 are used to support the heat sink 32 in such a manner as to allow the heat sink 32 to be separated from the first side 301 of the substrate 30 by a predetermined distance so that the top surface 322 of the heat sink 32 is fully exposed to the outside of the encapsulant 33. This allows the heat sink 32 to perform a high heat-dissipating efficiency and also allows the bottom surface 323 of the heat sink 32 to be separated from the chips 31a, 31b, 31c, and 31d and the gold wires 34. As shown in FIG. 4, in order to prevent the encapsulating resin from flashing over the top surface 322 of the heat sink 32 during the compound molding process, the supportive legs 321 are each arranged in such a manner that the distance from its bottom 321c to the top surface 322 of the heat sink 32 is slightly greater than the depth of the cavity 50 in the mold 5 that is used to form the encapsulant 33. This allows the top wall 500 of the cavity 50 to urge against the top surface 322 of the heat sink 32, thereby slightly deforming the portion of the heat sink 32 at the supportive legs 321. As a result of this, the top surface 322 of the heat sink 32 can be tightly attached to the top wall 500, thereby preventing the encapsulating resin from flashing during the molding process. Moreover, the injection pins 51 on the mold 5 are inserted in the openings 326 but unabutted on the heat sink 32.

Figure 3:
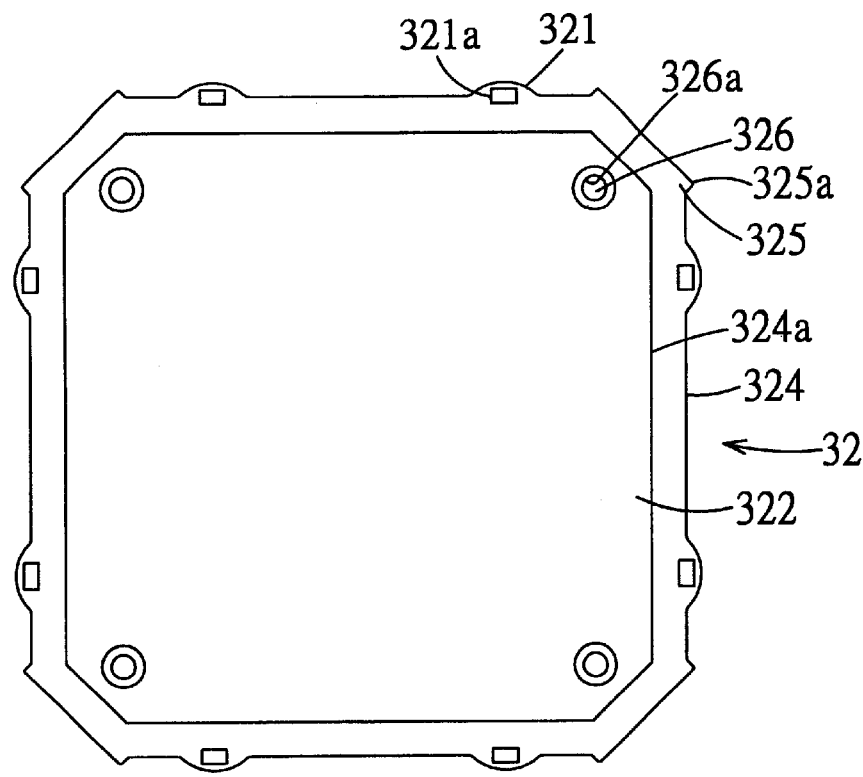
FIG. 3 is a top view of a heat sink utilized in the integrated circuit package of the invention.

Referring to FIGS. 3 and 4, the positioning tongues 325 on the heat sink 32 are each shaped with a curved edge 325a. After the heat sink 32 is disposed in the cavity 50 of the mold 5 over the substrate 30, the curved edge 325a is abutted on the side wall 501 of the cavity 50, allowing the heat sink 32 to be secured in the intended position. Hence, no jig is required to assemble the integrated circuit package of the invention. The drawback of using the jig, as in the case of the prior art, can thus be eliminated. Moreover, since there is no need to adhere the supportive legs 321 onto the substrate 30 by using adhesives, the drawback of delamination in the case of the prior art can be eliminated.

On the heat sink 32, since only the supportive legs 321 are protruded to beneath the bottom surface 323 of the heat sink 32, it can help the encapsulating resin flow in the molding process to flow smoothly to the beneath of the bottom surface 323 of the heat sink 32 without causing disturbance. As a result, the encapsulant 33 can be formed substantially without undesired voids therein.

Since the supportive legs 321 are formed near the corners of the heat sink 32, the portion of the heat sink 32 that comes into contact with the substrate 30 includes only the bottom 321c of the supportive legs 321. As a result, the substrate 30 can provide a larger chip mounting area than the prior art, allowing more chips can be packed in the integrated circuit package. Moreover, in order to allow the heat sink 32 to be reliably secured to the compound 33, a recessed portion 324a is formed in the surface of the sink 324 of the heat sink 32.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An integrated circuit package, which comprises:
    a substrate having a first side and a second side opposing the first side;
    first conductive traces formed on the first side of the substrate;
    second conductive traces formed on the second side of the substrate, which is electrically connected to the first conductive traces;
    at least one chip, which is mounted on the first side of the substrate and electrically connected to the first conductive traces;
    a plurality of solder balls provided at the terminal ends of the second conductive traces to allow external connection of the chip;
    a heat sink mounted on the first side of the substrate and, being formed with a plurality of supporting legs downwardly extending from sides of the heat sink and arranged in such a manner as to allow a bottom surface of the heat sink to be separated from the chip and a top surface of the heat sink to be tightly attached to a top wall of a cavity in a mold;
    a plurality of positioning tongues formed on the heat sink for securing the heat sink in position when performing a molding process; and
    an encapsulant which hermetically encloses the chip and part of the heat sink therein in a manner that the top surface of the heat sink is exposed to the outside of the encapsulant.

2. The integrated circuit package of claim 1, wherein the supportive legs are integrally formed with the heat sink and arranged on sides of the heat sink.

3. The integrated circuit package of claim 2, wherein the supportive legs are each formed with a hole to help enforce the bonding between the heat sink and the encapsulant.

4. The integrated circuit package of claim 1, wherein the heat sink is further formed with a plurality of openings each being used for receiving an injection pin of the mold for use in the molding process.

5. The integrated circuit package of claim 4, wherein the openings in the heat sink are formed near the corners of the heat sink.

6. The integrated circuit package of claim 4, wherein the openings in the heat sink are each formed with a toothed inner wall.

7. The integrated circuit package of claim 1, wherein the edge of the heat sink is formed with at least a recessed portion.

8. The integrated circuit package of claim 1, wherein the heat sink is formed in such a manner that the distance from a bottom of each of the supportive legs to the top side of the heat sink is greater than the depth of the cavity in the mold used to form the encapsulant.

9. The integrated circuit package of claim 1, wherein the chip is electrically connected to the first conductive traces via a plurality of gold wires.

10. The integrated circuit package of claim 1, wherein the chip is electrically connected to the first conductive traces by using flip-chip technology.

11. The integrated circuit package of claim 1, wherein the substrate is formed with a plurality of conductive vias to electrically interconnect the first conductive traces and the second conductive traces.

12. The integrated circuit package of claim 1, wherein the gap between the sides of the heat sink and the outer walls of the encapsulant is no greater than 0.1 mm.

13. The integrated circuit package of claim 1, wherein the heat sink is made of a heat-conductive material selected from the group consisting of copper, copper alloy, aluminum, and aluminum alloy.

14. The integrated circuit package of claim 1, wherein the heat sink is secured to the substrate without use of an adhesive.

* * * * *